US009424902B2

United States Patent
Chen et al.

(10) Patent No.: US 9,424,902 B2
(45) Date of Patent: Aug. 23, 2016

(54) MEMORY CONTROLLER AND ASSOCIATED METHOD FOR GENERATING MEMORY ADDRESS

(71) Applicant: MStar Semiconductor, Inc., Hsinchu Hsien (TW)

(72) Inventors: Chung-Ching Chen, Zhubei (TW); Chen-Nan Lin, Taipei (TW); Yung Chang, Hsinchu (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 229 days.

(21) Appl. No.: 14/228,390

(22) Filed: Mar. 28, 2014

(65) Prior Publication Data

US 2014/0293726 A1  Oct. 2, 2014

(30) Foreign Application Priority Data

Apr. 2, 2013 (TW) .............................. 102111928 A

(51) Int. Cl.
*G06F 12/00* (2006.01)
*G11C 8/18* (2006.01)
*G11C 8/06* (2006.01)
*G11C 8/10* (2006.01)

(52) U.S. Cl.
CPC . *G11C 8/18* (2013.01); *G11C 8/06* (2013.01); *G11C 8/10* (2013.01)

(58) Field of Classification Search
CPC .................. G11C 11/40618; G11C 11/4076; G11C 7/1048; G11C 8/08; G11C 11/4087; G11C 8/18; G11C 8/10; G11C 8/06; G06F 12/0607; G06F 13/1647; G06F 13/28
See application file for complete search history.

(56) References Cited

U.S. PATENT DOCUMENTS

| | | | |
|---|---|---|---|
| 2008/0244135 A1 | 10/2008 | Akesson et al. | |
| 2009/0296499 A1* | 12/2009 | Park | G11C 7/1048 365/189.17 |
| 2010/0208540 A1* | 8/2010 | Shiu | G11C 8/12 365/230.03 |
| 2012/0008451 A1* | 1/2012 | Cha | G11C 7/1066 365/230.03 |
| 2012/0026821 A1* | 2/2012 | Kang | G11C 11/406 365/222 |
| 2012/0087200 A1* | 4/2012 | Lee | G11C 8/12 365/230.03 |
| 2014/0078846 A1* | 3/2014 | Shin | G11C 11/40615 365/222 |
| 2014/0379979 A1* | 12/2014 | Jenkins | G11C 7/1066 711/106 |
| 2015/0006805 A1* | 1/2015 | Feekes | G06F 3/0604 711/105 |
| 2015/0277763 A1* | 10/2015 | Zhou | G06F 3/061 711/105 |
| 2015/0302904 A1* | 10/2015 | Yoon | G11C 5/04 711/105 |

* cited by examiner

*Primary Examiner* — John Lane
(74) *Attorney, Agent, or Firm* — Edell, Shapiro & Finnan, LLC

(57) ABSTRACT

A memory controller is connected to a double-data-rate dynamic random access memory (DDR DRAM) and an accessing unit. The memory controller includes: a processing unit, configured to receive a system address generated by the accessing unit; and a mapping unit, located in the processing unit, configured to convert the system address to a memory address and transmitting the memory address to the DDR DRAM. When a burst length of the DDR DRAM is L and $L=2^x$ (where L and x are positive integers), an $(x+1)^{th}$ bit of the memory address from a least significant bit (LSB) is included in a bank group address of the memory address.

18 Claims, 6 Drawing Sheets

US 9,424,902 B2

MEMORY CONTROLLER AND ASSOCIATED METHOD FOR GENERATING MEMORY ADDRESS

This application claims the benefit of Taiwan application Serial No. 102111928, filed Apr. 2, 2013, the subject matter of which is incorporated herein by reference.

BACKGROUND OF THE INVENTION

1. Field of the Invention

The invention relates in general to a memory controller, and more particularly to a memory controller applied to a double-data-rate dynamic random access memory (DDR DRAM).

2. Description of the Related Art

A double-data-rate dynamic random access memory (DDR DRAM), featuring a fast access speed and low costs, is a common temporary data storage component in a computer system or in an electronic device. With the continual evolvement of DDR DRAM, current computer systems or electronic devices are mostly equipped with a DDR generation-3 (DDR3) DRAM. An accessing unit, such as a central processing unit (CPU), a graphic processing unit (GPU) or other peripheral element, requires a memory controller to access the DDR3 DRAM.

With the progressing development of memory technologies, a DDR generation-4 (DDR4) DRAM has become available. However, memory address configurations of the DDR3 DRAM and the DDR4 DRAM are different. For example, a DDR3 DRAM address includes a bank address, a row address and a column address. According to the DDR4 DRAM specification, a DDR4 DRAM address includes a bank address, a bank group address, a row address and a column address. That is, compared to the DDR3 DRAM address, the DDR4 DRAM address additionally includes the bank group address.

Further, based on the DDR4 DRAM specification, there are more parameters that limit data access. Thus, in a DDR4 DRAM system, a memory controller needs a novel method for generating a memory address to effectively utilize the DDR4 DRAM.

SUMMARY OF THE INVENTION

A memory controller is provided by the present invention. The memory controller, connected to a double-data-rate dynamic random access controller (DDR DRAM) and an accessing unit, includes: a processing unit, configured to receive a system address generated by the accessing unit; and a mapping unit, located in the processing unit, configured to convert the system address to a memory address and forwarding the memory address to the DDR DRAM. A burst length of the DDR DRAM is set to be L and $L=2^x$, and an $(x+1)^{th}$ bit from a least significant bit (LSB) of the memory address is included in a bank group address of the memory address, where L and x are positive integers.

A method for generating a memory address is further provided by the present invention. The method, for addressing a DDR DRAM, includes: determining parameters of a memory address associated with the DDR DRAM, the parameters including an Rn-bit row address, a Bn-bit bank address, a Gn-bit bank group address, and a Cn-bit column address; determining a burst length of the DDR DRAM as L, where $L=2^x$; setting [(x−1):0] bits in a received system address as a first-part column address COL[(x−1):0]; and setting an [x] bit of the system address to be included in the Gn-bit bank group address.

A method for generating a memory address for addressing a DDR DRAM is further provided by the present invention. The method includes: determining a memory address of the DDR DRAM, the memory address including a bank group address; determining a burst length of the DDR DRAM as L, where $L=2^x$; receiving a system address; and setting an $(x+1)^{th}$ bit from a least significant bit (LSB) of the system address to be included in the bank group address of the memory address.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1:
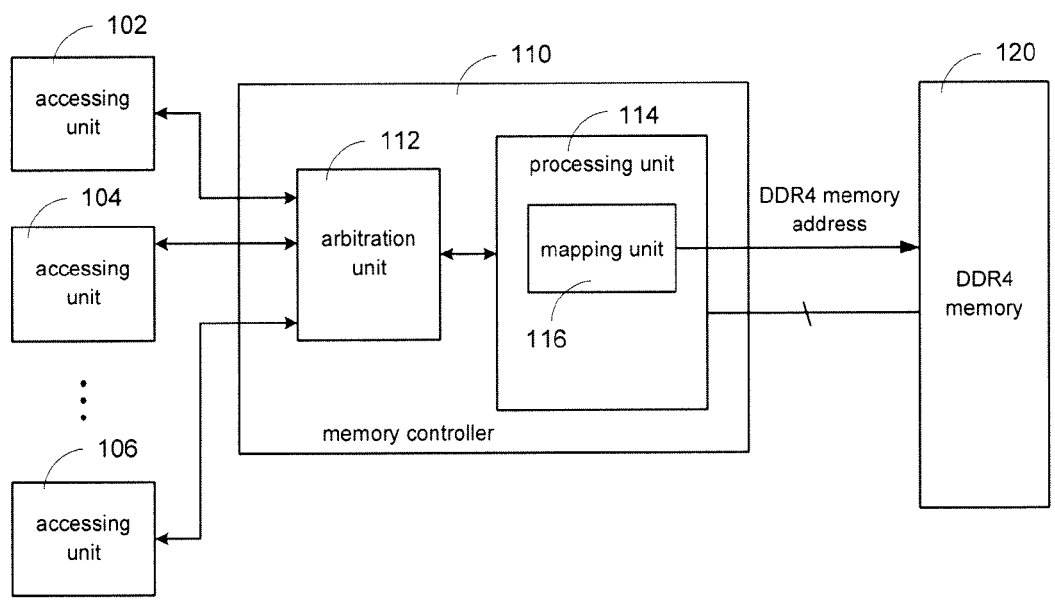
FIG. 1 is a schematic diagram of a system of a DDR4 DRAM according to an embodiment of the present invention.

FIG. 1 shows a schematic diagram of a memory access system.

In FIG. 1, a DDR4 memory is taken as an example, and other DDR DRAMs may also be applied. A memory controller 110 is connected to multiple accessing units 102, 104 and 106, and a DDR4 memory 120. Each of the accessing units 102, 104 and 106 accesses data from the DDR4 memory 120 via the memory controller 110.

The memory controller 110 includes an arbitration unit 112 and a processing unit 114. The processing unit 114 includes a mapping unit 116. As shown in FIG. 1, the arbitration unit 112 is connected to all of the accessing units 102, 104 and 106, and arbitrates the access priority to the DDR4 memory 120 for the accessing units 102, 104 and 106.

For example, when the arbitration unit 112 determines that the accessing unit 102 has permission to access the DDR4 memory 120, a read instruction and a system address generated by the access unit 102 are transmitted to the processing unit 114. The mapping unit 116 in the processing unit 114 converts the system address into a memory address compliant to the specification of the DDR4 memory 120, and then transmits the read instruction and the memory address to the DDR4 memory 120. The DDR4 memory 120 retrieves data according to the memory address, and forwards the retrieved data to the accessing unit 102 via the memory controller 110 to complete a current read transaction.

Similarly, when the accessing unit 102 wishes to write data, a write instruction, a system address and data are transmitted to the processing unit 114. After the mapping unit 116 in the processing unit 114 converts the system address into a memory address, the processing unit 114 forwards the write instruction, the memory address and the data to the DDR4 memory 120. The DDR4 memory 120 records the data according to the memory address to complete a current write transaction.

It is known from the above description, after the mapping unit 116 receives the system address, the system address needs to be first converted into a memory address that is then forwarded to the DDR4 memory 120. The DDR4 memory 120 completes the transaction according to the memory address and the instruction.

According to the DDR4 memory specification, a DDR4 memory address includes a bank address, a bank group address, a row address and a column address. When successively accessing data, an interval between time points at which instructions are sent out is restricted by tCCD_L and tCCD_S parameters. That is to say, when the memory controller 110 successively sends out two read or write instructions to the DDR4 memory 120, a time interval tCCD_L is required between the two instructions if the two corresponding bank group addresses in the memory address are the same. On the other hand, when the memory controller 110 successively sends out two read or write instructions to the DDR4 memory 120, a time interval tCCD_S is required between two instructions if the two corresponding bank group addresses in the memory address are different. Wherein, tCCD_L>tCCD_S. In the description below, tCCD_L is exemplified by a period of 6 clocks (6T), and tCCD_S is exemplified by a period of 4 clocks (4T) for explanation purposes.

Figure 2:
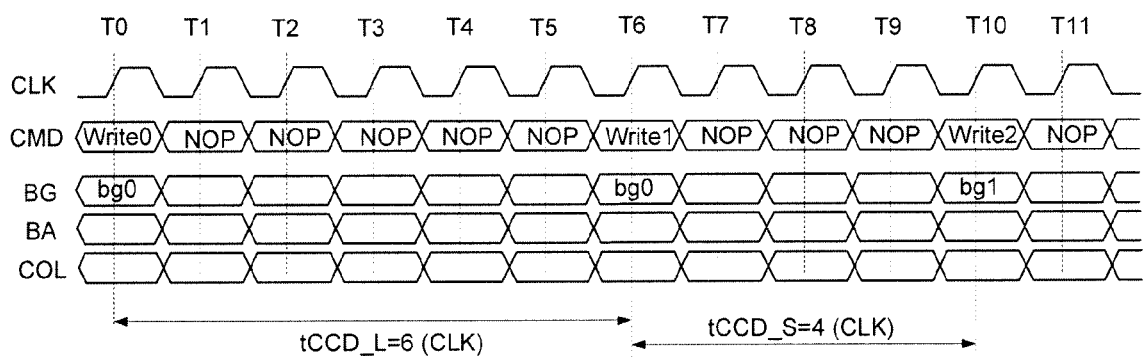
FIG. 2 is a schematic diagram of associated signals when a memory controller sends out write instructions.

FIG. 2 shows a schematic diagram of associated signals when the memory controller 110 sends out write instructions. It is assumed that the memory controller 110 is to send out three write instructions Write0, Write1 and Write2, the instruction Write0 corresponds to the bank group address (BG) bg0 in the memory address, the instruction Write1 corresponds to the bank group address (BG) bg0 in the memory address, and the instruction Write2 corresponds to the bank group address (BG) bg1 in the memory address.

As shown in FIG. 2, the write instruction Write0 generated at the time point T0 corresponds to the memory group address (BG) bg0. As the instruction Write1 also corresponds to the bank group address (BG) bg0, according to the specification of tCCD_L, the memory controller 110 generates the instruction Write1 at the time point T6, and between the time points T0 and T6 is a no-operation (NOP) period. Further, as the instruction Write2 corresponds to the bank group address (BG) bg1, according to the specification of tCCD_S, the memory controller 110 generates the instruction Write2 at the time point T10, and between the time points T6 and T10 is a no-operation (NOP) period. It is apparent that, the instructions Write0 and Write1 are spaced by 6 clocks (6T), and the instructions Write1 and Write2 are spaced by only 4 clocks (4T).

It is known from the above description, the utilization efficiency of the DDR4 memory gets higher when a change occurs in the bank group address (BG) as successively instructions are written. Conversely, the utilization efficiency of the DDR4 memory gets lower when no change occurs in the bank group address (BG) as successive instructions are written.

Similarly, an interval between time points at which read instructions are sent out is also restricted by tCCD_L and tCCD_S parameters, and associated details are omitted herein.

Figure 3:
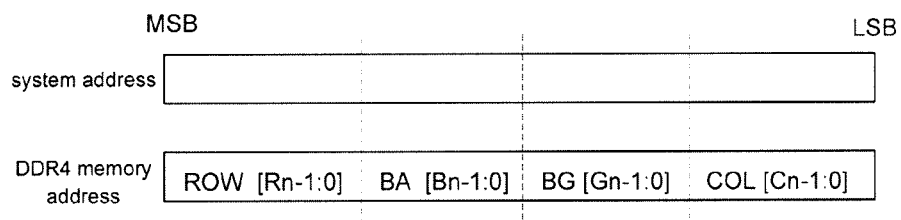
FIG. 3 is a schematic diagram of a mapping unit converting a system address to a DDR4 memory address.

FIG. 3 shows a schematic diagram of the mapping unit 116 converting a system address into a memory address of a DDR4 memory. In general, after the mapping unit 116 receives the system address of an accessing unit, the system address is divided into four parts from a most significant bit (MSB) to a least significant bit (LSB) according to the DDR4 memory specification, and the four divided parts are sequentially utilized as a row address (ROW), a bank address (BA), a bank group address (BG), and a column address (COL). In FIG. 3, the DDR4 memory address includes an Rn-bit row address (ROW[Rn−1:0]), a Bn-bit bank address (BA[Bn−1:0]), a Gn-bit bank group address (BG[Gn−1:0]), and a Cn-bit column address (COL[Cn−1:0]).

However, when the mapping unit 116 of the memory controller 110 generates the DDR4 memory address according to the method in FIG. 3, the utilization efficiency of the DDR4 memory is severely lowered as the DDR4 memory address is successively accessed. One reason for such occurrence is that, the successively accessed DDR4 memory address only causes the column address (COL[Cn−1:0]) to change while leaving the bank group address (BG[Gn−1:0]) unchanged. Therefore, when the memory controller 110 accesses the successive DDR4 memory address, the utilization efficiency of the DDR4 memory is lowered due to the restriction posed by the tCCD_L parameter.

In the present invention, the method that the mapping unit 116 generates the DDR4 memory address is changed under the architecture in FIG. 1. As such, a restriction is posed by only the tCCD_S parameter when the memory controller 110 accesses the successive DDR4 memory address, and the utilization efficiency of the DDR4 memory can thus be effectively enhanced. Associated details are given below.

Figure 4:
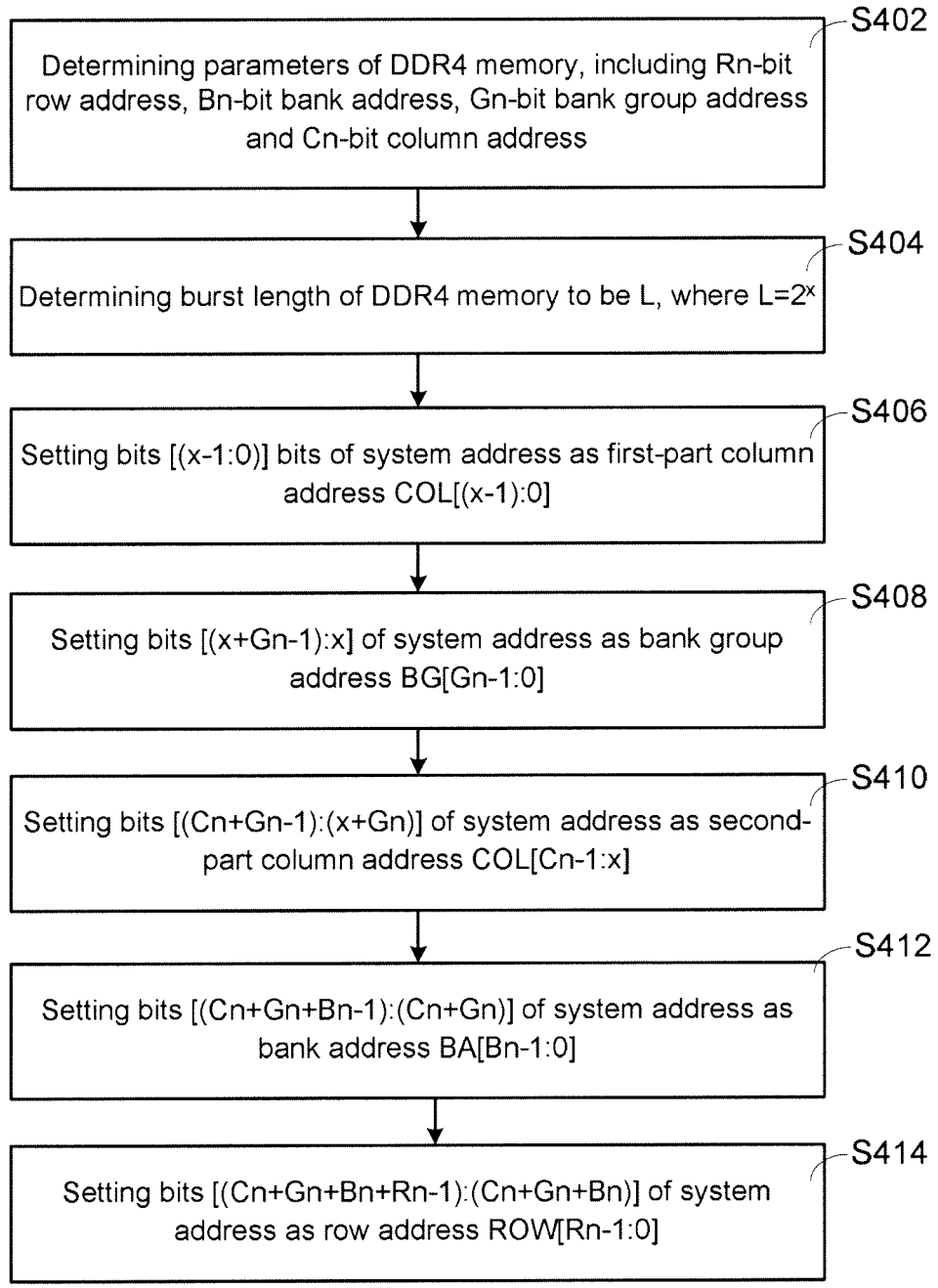
FIG. 4 is a flowchart of a method for generating a DDR4 memory address according to an embodiment of the present invention.

FIG. 4 shows a method for generating a DDR4 memory address according to a first embodiment of the present invention. In step S402, parameters of the DDR4 memory address are determined, including the Rn-bit row address, the Bn-bit bank address, the Gn-bit bank group address, and the Cn-bit column address, where Rn, Bn, Gn and Cn are positive integers. In step S404, a burst length of the DDR4 memory is determined to be L, where $L=2^x$. In general, the burst length L of the DDR4 memory may be set to 8 or 4, and x is then 3 or 2. That is, L and x are positive integers greater than 0.

In step S406, bits [(x−1):0] of the system address are set as a first-part column address COL[(x−1):0]. In step S408, bits [(x+Gn−1):x] of the system address are set as the bank group address BG[Gn−1:0]. In step S410, bits [(Cn+Gn−1):(x+Gn)] of the system address are set as a second-part column address COL[Cn−1:x]. In step S412, bits [(Cn+Gn+Bn−1):(Cn+Gn)] of the system address are set as the bank address BA[Bn−1:0]. In step S414, bits [(Cn+Gn+Bn+Rn−1):(Cn+Gn+Bn)] of the system address are set as the row address ROW[Rn−1:0]. That is to say, according to the above method, the mapping unit 116 may translate the system address into the DDR4 memory address, which is arranged from the MSB to the LSB as ROW[Rn−1:0], BA[Bn−1:0], COL[Cn−1:x], BG[Gn−1:0], and COL[(x−1):0].

Figures 5A, 5B:
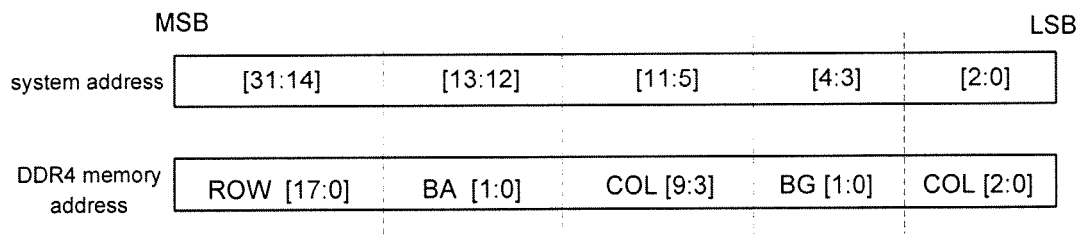
FIG. 5A and FIG. 5B are an address table of a 16 GB DDR4 memory formed by four 4 GB dies, and a schematic diagram of a DDR4 memory address generated according an embodiment of the present invention.

FIG. 5A and FIG. 5B are an address table of a 16 GB DDR4 memory formed by four 4 GB dies, and a schematic diagram of a DDR4 memory address generated according the first embodiment of the present invention. Fundamentally, the 16 GB DDR4 memory may also be formed by eight 2 GB dies or sixteen 1 GB dies. With different compositions, the numbers of the row address, column address, bank group address and bank address may be different. In the description below, a 16 GB DDR4 memory formed by four 4 GB dies is taken as an example for explaining the present invention, not limiting the present invention.

According to the DDR4 memory specification, parameters of the address of the 16 GB DDR4 memory formed by four 4 GB dies are known. More specifically, the DDR4 memory needs a row address having 18 bits from A0 to A17 (Rn=18), a column address having 10 bits from A0 to A9 (Cn=10), bank group addresses BG0 and BG1 having a total of 2 bits (Gn=2), and bank addresses BA0 and BA1 having a total of 2 bits (Bn=2). Further, it is assumed that the burst length of the DDR4 memory is set to 8, where $8=2^x$ and x=3.

As shown in FIG. 5B, bits [2:0] (i.e., [(x-1):0]) of the system address are set as the firs-part column address COL[2:0] (i.e., COL[(x-1):0]) of the DDR4 memory address, bits [4:3] (i.e., [(x+Gn-1):x]) of the system address are set as the bank group address BG[1:0] (i.e., BG[(Gn-1):0]) of the DDR4 memory address, bits [11:5] (i.e., [(Cn+Gn-1):(x+Gn)]) of the system address are set as the second-part column address COL[9:3] (i.e., COL[(Cn-1):x]) of the DDR4 memory address, bits [13:12] (i.e., [(Cn+Gn+Bn-1):(Cn+Gn)]) of the system address are set as the bank address BA[1:0] (i.e., BA[(Bn-1):0]) of the DDR4 memory address, and bits [31:14] (i.e., [(Cn+Gn+Bn+Rn-1):(Cn+Gn+Bn)]) of the system address are set as the row address ROW[17:0] (i.e., ROW[(Rn-1):0]) of the DDR4 memory address. Thus, the DDR4 memory address generated by the mapping unit 116 is arranged from the MSB to the LSB as ROW[17:0], BA[1:0], COL[9:3], BG[1:0], and COL[2:0].

In the embodiment, as the burst length of the DDR4 memory is 8, when the memory controller 110 accesses the successive DDR4 memory address, the $4^{th}$ bit from the LSB of the DDR4 memory address, i.e., the $(x+1)^{th}$ bit, continues changing. The $4^{th}$ bit is included in the bank group address BG[1:0]. When the memory controller 110 accesses the successive DDR4 memory address, the bank group address BG[1:0] continues changing such that the instructions generated by the memory controller 110 are restricted by only the tCCD_S parameter, thereby effectively enhancing the utilization efficiency of the DDR4 memory.

With the above description, a method and apparatus for generating a DDR4 memory address are disclosed by the present invention. When the burst length of a DDR4 memory is L and $L=2^x$, the mapping unit 116 sets the $(x+1)^{th}$ bit from the LSB of the system address as the $(x+1)^{th}$ bit from the LSB of the DDR4 memory address, and the $(x+1)^{th}$ bit is included in the bank group address. Thus, when the memory controller 110 accesses the successive DDR4 memory address, the instructions generated by the memory controller 110 are restricted by only the tCCD_S parameter, thereby effectively enhancing the utilization efficiency of the DDR4 memory.

Figure 6:
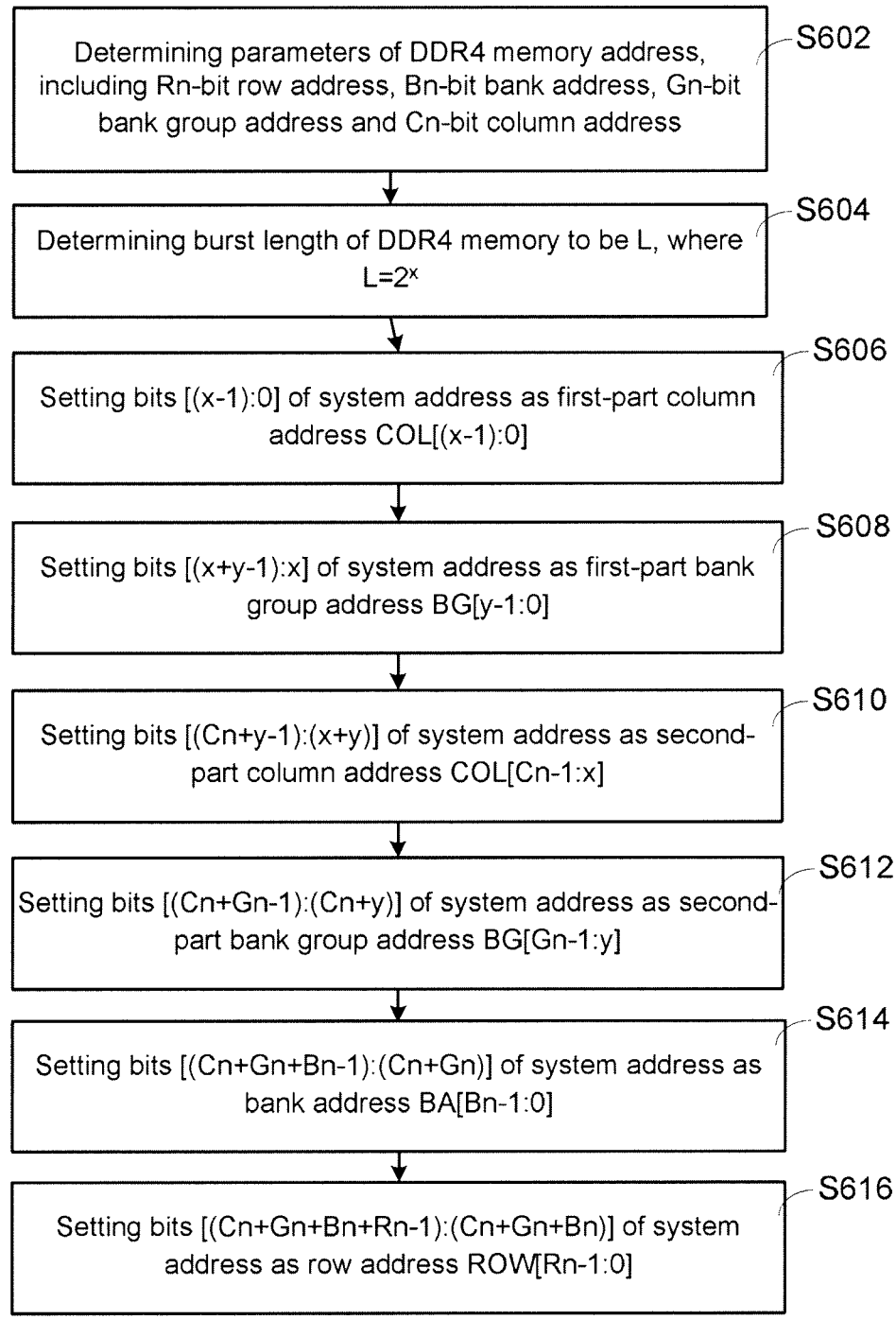
FIG. 6 is a flowchart of a method for generating a DDR4 memory address according to an embodiment of the present invention.

FIG. 6 shows a method for generating a DDR4 memory address according to a second embodiment of the present invention. In step S602, parameters of the DDR4 memory address are determined, including the Rn-bit row address, the Bn-bit bank address, the Gn-bit bank group address, and the Cn-bit column address. In step S604, a burst length of the DDR4 memory is determined to be L, where $L=2^x$.

In step S606, bits [(x-1):0] of the system address are set as a first-part column address COL[(x-1):0]. In step S608, bits [(x+y-1):x] of the system address are set as a first-part bank group address BG[y-1:0], where y is a positive integer greater than 0 and smaller than or equal to Gn. In step S610, bits [(Cn+y-1):(x+y)] of the system address are set as a second-part column address COL[Cn-1:x]. In step S612, bits [(Cn+Gn-1):(Cn+y)] of the system address are set as a second-part bank group address BG[Gn-1:y]. In step S614, bits [(Cn+Gn+Bn-1):(Cn+Gn)] of the system address are set as a bank address BA[Bn-1:0]. In step S616, bits [(Cn+Gn+Bn+Rn-1):(Cn+Gn+Bn)] of the system address are set as a row address ROW[Rn-1:0].

According to the above approach, the mapping unit 116 translates the system address into the DDR4 memory address, arranging from the MSB to the LSB into ROW[Rn-1:0], BA[Bn-1:0], BG[Gn-1:y], COL[Cn-1:x], BG[y-1:0], and COL[(x-1):0].

Figure 7:
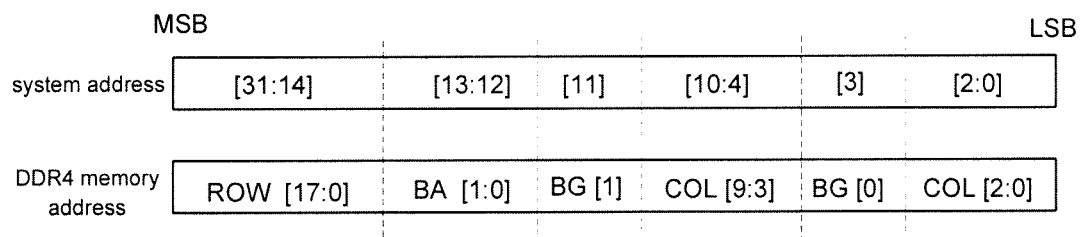
FIG. 7 is a schematic diagram of a DDR4 memory address generated according an embodiment of the present invention.

FIG. 7 shows a schematic diagram of a DDR4 memory address generated according to the second embodiment of the present invention. The DDR4 memory address in FIG. 7 is generated according to an addressing table of the 16 GB DDR4 memory formed by four 4 GB dies in FIG. 5A.

Similarly, according to the specification of the DDR4 memory in FIG. 5A, parameters of the address of the 16 GB DDR4 memory formed by four 4 GB dies are known. More specifically, the DDR4 memory needs a row address having 18 bits from A0 to A17 (Rn=18), a column address having 10 bits from A0 to A9 (Cn=10), bank group addresses BG0 and BG1 having a total of 2 bits (Gn=2), and bank addresses BA0 and BA1 having a total of 2 bits (Bn=2). Further, it is assumed that the burst length of the DDR4 memory is set to 8, where $8=2^x$ and x=3.

When y is equal to 1, as shown in FIG. 7, bits [2:0] of the system address are set as a first-part column address COL[2:0] of the DDR4 memory, bit [3] of the system address is set as the bank group address BG[0] of the DDR4 memory, bits [10:4] of the system address are set as a second-part column address COL[9:3] of the DDR4 memory, bit [11] of the system address is set as the bank group address BG[1] of the DDR4 memory, bits [13:12] of the system address are set as the bank address BA[1:0] of the DDR4 memory, and bits [31:14] of the system address are set as the row address ROW[17:0] of the DDR4 memory. In the embodiment, the DDR4 memory generated is arranged from the MSB to the LSB as ROW[17:0], BA[1:0], BG[1], COL[9:3], BG[0], and COL[2:0].

According to the second embodiment of the present invention, in the DDR4 memory address, the $4^{th}$ bit from the LSB, i.e., the $(x+1)^{th}$ bit, continues changing. The $(x+1)^{th}$ bit is included in the bank group address BG[1:0]. Therefore, when the memory controller 110 accesses the successive memory address, the bank group address BG[1:0] continues changing such that the instructions generated by the memory controller 110 are restricted by only the tCCD_S parameter, thereby effectively enhancing the utilization efficiency of the DDR4 memory.

In the second embodiment of the present invention, when y is set to 2, the DDR4 memory address generated is as shown in FIG. 5B, and associated details shall be omitted herein.

In the present invention, during the process that the mapping unit 116 converts the system address into the DDR4 memory address, the DDR4 memory address, starting from the $(x+1)^{th}$ bit from the LSB, is mapped into the bank group address. Thus, the utilization efficiency of the DDR4 memory is effectively enhanced when the memory controller accesses the successive DDR4 memory address.

In the present invention, at other addresses of the DDR4 memory address, e.g., the row address or the bank address, the object of enhancing the utilization efficiency of the DDR4 memory may also be achieved through a method other than the arrangement methods in FIGS. 5B and 7. In other words, in the first embodiment in FIG. 4, the arrangement of the address subsequent to step S410 may be appropriately modified. Similarly, in the second embodiment in FIG. 6, the arrangement of the address subsequent to step S610 may also be appropriate modified to similarly achieve the object of the present invention.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory controller, connected to a double-data-rate dynamic random access memory (DDR DRAM) and an accessing unit, comprising:
   a mapping unit, configured to convert a system address generated by the accessing unit into a memory address and to transmit the memory address to the DDR DRAM;
   wherein, a burst length of the DDR DRAM is L and $L=2^x$, an $(x+1)^{th}$ bit from a least significant bit (LSB) of the memory address is in a bank group address, and L and x are positive integers.

2. The memory controller according to claim 1, further comprising:
   a processing unit, configured to receive the system address generated by the accessing unit;
   wherein, the mapping unit is located in the processing unit.

3. The memory controller according to claim 2, further comprising:
   an arbitration unit, connected to the accessing unit;
   wherein, when the arbitration unit determines the accessing unit is permitted to access the DDR DRAM, the accessing unit generates an access instruction and the system address to the processing unit.

4. The memory controller according to claim 1, wherein the DDR DRAM is a DDR generation-4 (DDR4) DRAM.

5. The memory controller according to claim 1, wherein the mapping unit translates the system address into a row address, a bank address, the bank group address and a column address that form the memory address.

6. A method for generating a memory address, applied to a DDR DRAM, comprising:
   determining parameters of a memory address associated with the DDR DRAM, the parameters comprising an Rn-bit row address, a Bn-bit bank address, a Gn-bit bank group address, and a Cn-bit column address;
   determining a burst length of the DDR DRAM to be L, where $L=2^x$;
   setting [(x−1):0] bits of a received system address as a first-part column address COL[(x −1):0]; and
   setting an [x] bit of the system address to be comprised in the Gn-bit bank group address;
   wherein, Rn, Bn, Gn, Cn, L and x are positive integers.

7. The method according to claim 6, further comprising:
   setting [(x+Gn−1):x] bits of the system address as the Gn-bit bank group address BG[Gn−1:0].

8. The method according to claim 7, further comprising:
   setting [(Cn+Gn−1):(x+Gn)] of the system address as a second-part column address COL[Cn −1:x];
   setting [(Cn+Gn+Bn−1):(Cn+Gn)] bits of the system address as the Bn- bit bank address BA[Bn−1:0];
   setting [(Cn+Gn+Bn+Rn−1):(Cn+Gn+Bn)] bits of the system address as the Rn-bit row address ROW[Rn−1:0]; and
   arranging the memory address from an MSB to an LSB as the Rn-bit row address ROW[Rn−1:0], the Bn−bit bank address BA[Bn−1:0], the second-part column address COL[Cn−1:x], the Gn-bit bank group address BG[Gn−1:0], and the first-part column address COL[(x−1):0].

9. The method according to claim 6, further comprising:
   setting [(x+y−1):x] bits of the system address as a first-part bank group address BG[y−1:0], where y is a positive integer smaller than or equal to Gn.

10. The method according to claim 9, further comprising:
    setting [(Cn+y−1):(x+y)] bits of the system address as a second-part column address COL[Cn-1:x];
    setting [(Cn+Gn−1):(Cn+y)] bits of the system address as a second-part bank group address BG[Gn−1:y];
    setting [(Cn+Gn+Bn−1):(Cn+Gn)] of the system address as the Bn-bit bank address BA[Bn−1:0];
    setting [(Cn+Gn+Bn+Rn−1):(Cn+Gn+Bn)] bits of the system address as the Rn-bit row address ROW[Rn−1:0]; and
    arranging the memory address from an MSB to an LSB as the Rn-bit row address ROW[Rn−1:0], the Bn-bit bank address BA[Bn−1:0], the second-part bank group address BG[Gn−1:y], the second-part column address COL[Cn−1:x], the first-part bank group address BG[y−1:0], and the first-part column address COL[(x−1):0].

11. The method according to claim 6, wherein the DDR DRAM is a DDR4 DRAM.

12. A method for generating a memory address, for addressing a DDR DRAM, comprising:
    determining a memory address of the DDR DRAM, the memory address comprising a bank group address;
    determining a burst length of the DDR DRAM to be L, where $L=2^x$;
    receiving a system address; and
    setting an $(x+1)^{th}$ bit from an LSB of the system address to be comprised in the bank group address of the memory address; wherein, L and x are positive integers.

13. The method according to claim 12, wherein the DDR DRAM is a DDR4 DRAM.

14. The method according to claim 12, wherein the memory address further comprises an Rn-bit row address, a Bn-bit bank address, the Gn-bit bank group address, and a Cn-bit row address; wherein, Rn, Bn, Gn and Cn are positive integers.

15. The method according to claim 14, further comprising:
    setting [(x−1):0] bits of the system address as a first-part column address COL[(x−1):0]; and
    setting [(x+Gn−1):x] bits of the system address as the Gn-bit bank group address BG[Gn−1:0].

16. The method according to claim 15, further comprising:
    setting [(Cn+Gn−1):(x+Gn)] bits of the system address as a second-part column address COL[Cn-1:x];
    setting [(Cn+Gn+Bn−1):(Cn+Gn)] bits of the system address as the Bn-bit bank address BA[Bn−1:0];

setting [(Cn+Gn+Bn+Rn−1):(Cn+Gn+Bn)] bits of the system address as the Rn-bit row address ROW[Rn−1:0]; and arranging the memory address from an MSB to the LSB as the Rn-bit row address ROW[Rn−1:0], the Bn-bit bank address BA[Bn−1:0], the second-part column address COL[Cn−1:x], the Gn-bit bank group address BG[Gn−1:0], and the first-part column address COL[(x−1):0].

17. The method according to claim 14, further comprising:

setting [(x−1):0] bits of the system address as a first-part column address COL[(x−1):0]; and setting [(x+y−1):x] bits of the system address as a first-part bank group address BG[y−1:0], where y is a positive integer smaller than or equal to Gn.

18. The method according to claim 15, further comprising:

setting [(Cn+y−1):(x+y)] bits of the system address as a second-part column address COL[Cn−1:x];

setting [(Cn+Gn−1):(Cn+y)] bits of the system address as a second-part bank group address BG[Gn−1:y];

setting [(Cn+Gn+Bn−1):(Cn+Gn)] bits of the system address as the Bn-bit bank address BA[Bn−1:0];

setting [(Cn+Gn+Bn+Rn−1):(Cn+Gn+Bn)] bits of the system address as the Rn-bit row address ROW [Rn−1:0]; and arranging the memory address from an MSB to the LSB as the Rn-bit row address ROW[Rn−1:0], the Bn-bit bank address BA[Bn−1:0], the second-part bank group address BG[Gn−1:y], the second-part column address COL[Cn−1:x], the first-part bank group address BG[y−1:0], and the first-part column address COL[(x−1):0].

* * * * *